United States Patent
Saitou (10) Patent No.: US 8,222,540 B2
(45) Date of Patent: Jul. 17, 2012

(54) PRINTED WIRING BOARD AND ELECTRONIC-COMPONENT PACKAGE

(75) Inventor: Akiyoshi Saitou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 168 days.

(21) Appl. No.: 12/775,916

(22) Filed: May 7, 2010

(65) Prior Publication Data

US 2010/0288545 A1    Nov. 18, 2010

(30) Foreign Application Priority Data

May 14, 2009    (JP) ................................. 2009-117620

(51) Int. Cl.
*H05K 1/11* (2006.01)
(52) U.S. Cl. ........................................ 174/262; 361/792
(58) Field of Classification Search .......... 174/262–266; 361/792–795; 29/852–853
See application file for complete search history.

(56) References Cited

U.S. PATENT DOCUMENTS 6,639,154 B1 * 10/2003 Cartier et al. ................. 174/255

FOREIGN PATENT DOCUMENTS

JP    2-24568 U    2/1990
JP    6-97660 A    4/1994

* cited by examiner

*Primary Examiner* — Jeremy Norris
(74) *Attorney, Agent, or Firm* — Westerman, Hattori, Daniels & Adrian, LLP (57) ABSTRACT

A printed wiring board having an insulating core; a plurality of vias having axes parallel to and at equal distance from a reference axis and passing through the core; a first conductive film formed on a front surface of the core from the reference axis to each of the individual vias; a first insulating film stacked on the front surface of the core and covering the first conductive film; a first connecting via having an axis identical to the reference axis and passing through the first stacked film; a second conductive film formed on a back surface of the core from the reference axis to each of the individual vias; a second insulating film stacked on the back surface of the core and covering the second conductive film; and a second connecting via having an axis identical to the reference axis and passing through the second stacked film.

14 Claims, 11 Drawing Sheets

PRINTED WIRING BOARD AND ELECTRONIC-COMPONENT PACKAGE

This application is based upon and claims the benefit of priority from the prior Japanese Patent Application No. 2009-117620 filed on May 14, 2009, the entire contents of which are incorporated herein by reference.

BACKGROUND

1. Field

The present invention relates to a printed wiring board.

2. Description of Related Art

Electronic-component packages, for example, an LSI (large-scale integrated circuit) chip package, are widely known. The electronic-component packages are equipped with a printed wiring board, that is, a package substrate. An electronic component is mounted on the surface of the package substrate. Connection terminals, for example, a ball grid array, are mounted on the back of the package substrate. The individual connection terminals are electrically connected to the electronic component with vias in the package substrate.

SUMMARY

According to an embodiment, a printed wiring board includes: an insulating core; a plurality of vias having axes parallel to and at equal distance from a reference axis and passing through the core; a first conductive film formed on a front surface of the core from the reference axis to each of the individual vias; a first insulating film stacked on the front surface of the core and covering the first conductive film; a first connecting via having an axis identical to the reference axis and passing through the first stacked film; a second conductive film formed on a back surface of the core from the reference axis to the individual vias; a second insulating film stacked on the back surface of the core and covering the second conductive film; and a second connecting via having an axis identical to the reference axis and passing through the second stacked film.

It is to be understood that both the foregoing summary description and the following detailed description are explanatory as to some embodiments of the present invention, and not restrictive of the present invention as claimed.

DESCRIPTION OF EXAMPLE EMBODIMENTS

An embodiment of the present invention will be described hereinbelow with reference to the attached drawings.

Figure 1:
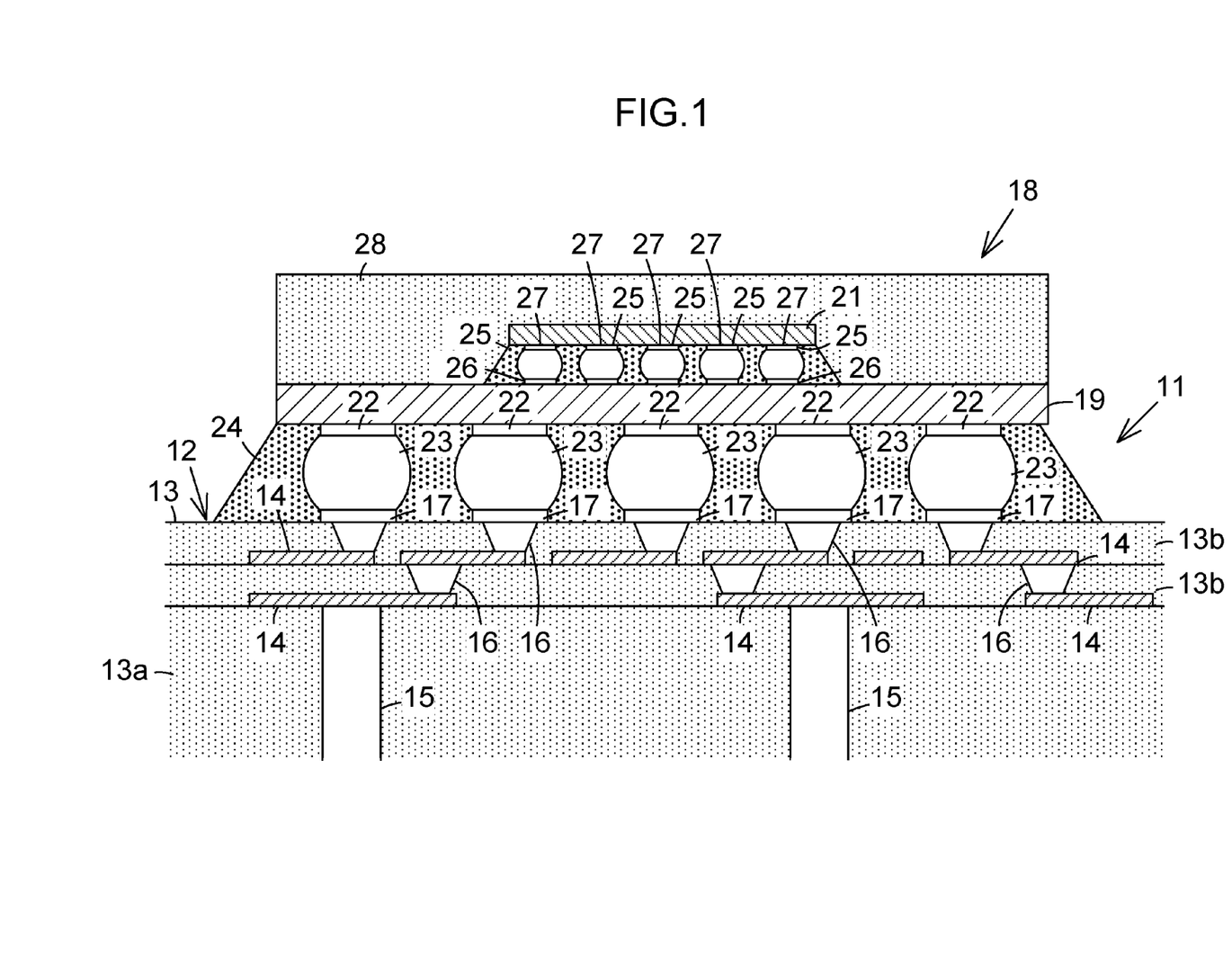
FIG. 1 is a schematic fragmentary sectional view showing the configuration of a printed board unit according to an embodiment.

FIG. 1 schematically shows the configuration of a printed board unit according to an embodiment. The printed board unit 11 includes a large printed wiring board 12. The printed wiring board 12 includes a substrate 13 formed of, for example, plastic. The substrate 13 is formed into, for example, a multilayer substrate. The multilayer substrate includes a core layer 13a. One or more stacked films 13b are formed on the front and back surfaces of the core layer 13a. Conductive solid film and conductive wiring patterns 14, for example, are formed on the front and back surfaces of the core layer 13a and on the front surface of the stacked films 13b. The solid films function as, for example, a power source layer and a ground layer. The wiring patterns 14 function as, for example, signal transmission paths. The power source layer and the ground layer are connected to a conductive film and conductive pads on the front layer with, for example, conductive through-holes. The wiring patterns 14 are connected to one other and connected to the conductive film and the conductive pads 17 on the front surface with, for example, conductive through-holes 15 and conductive vias 16. The solid film, the wiring patterns 14, the through-holes 15, and the vias 16 are formed of a metal material, such as copper.

A concrete example of an electronic-component package, that is, an LSI (large-scale integrated circuit) chip package 18, is mounted on the front surface of the printed wiring board 12. The LSI chip package 18 includes a small printed wiring board, that is, a package substrate 19. An LSI chip 21 is mounted on the front surface of the package substrate 19. A plurality of conductive pads 22 are mounted on the back surface of the package substrate 19. One solder bump 23, for example, is connected to each of the conductive pads 22. The individual solder bumps 23 are also connected to the conductive pads 17 on the printed wiring board 12. Thus, the LSI chip package 18 is electrically connected to the printed wiring board 12. The solder bumps 23 are sealed with an underfill material 24. The underfill material 24 fills the space between the printed wiring board 12 and the package substrate 19.

The LSI chip 21 is fitted with a plurality of conductive pads 25. The front surface of the package substrate 19 is likewise fitted with a plurality of conductive pads 26. The conductive pads 26 on the package substrate 19 are in a one-to-one correspondence with the conductive pads 25 on the LSI chip 21. One gold bump 27, for example, is connected to each of the conductive pads 25 on the LSI chip 21. The individual gold bumps 27 are also connected to the conductive pads 26 on the package substrate 19. The LSI chip 21 is sealed on the package substrate 19 with a sealing material 28. The sealing material 28 is, for example, plastic.

Figure 2:
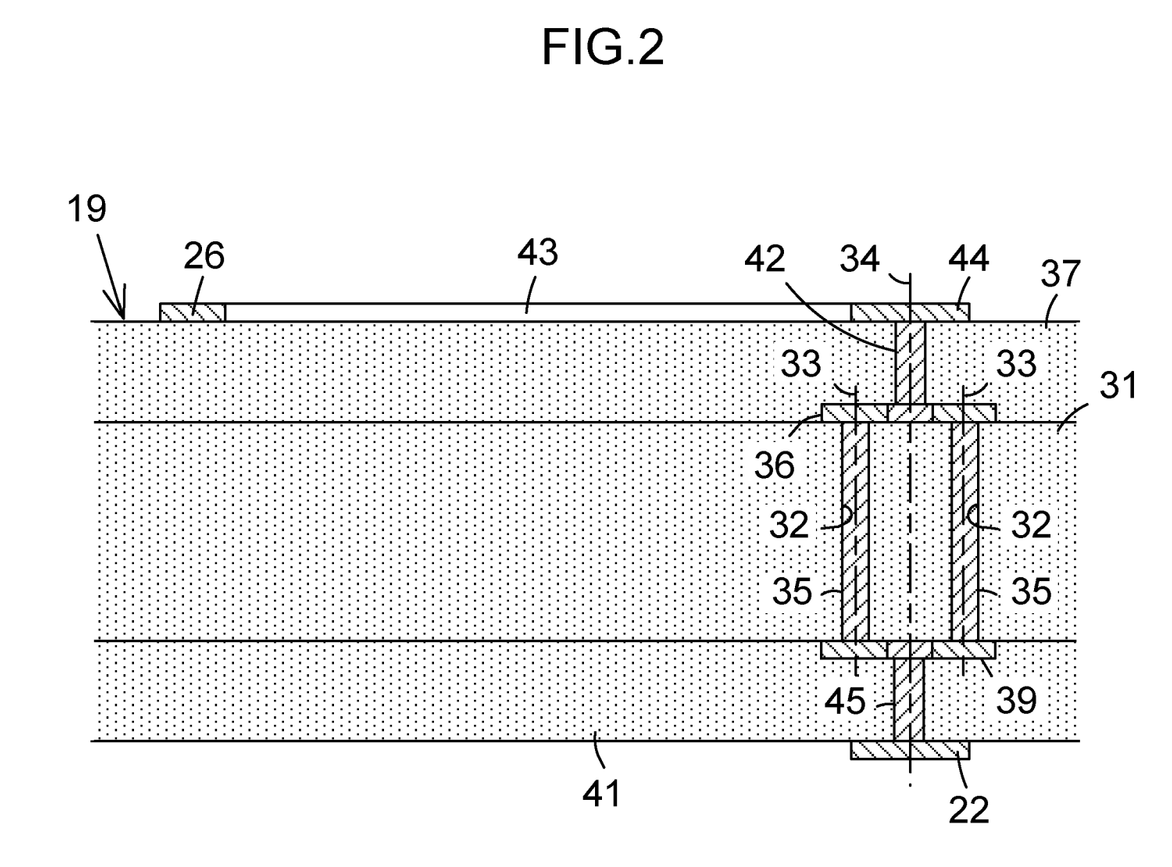
FIG. 2 is an enlarged schematic fragmentary sectional view showing the configuration of a package substrate.

As shown in FIG. 2, the package substrate 19 includes an insulating core layer 31. The core layer 31 has a plurality of through-holes 32 for, for example, each of the conductive pads 26 (22). The individual through-holes 32 pass through the core layer 31 from the front surface to the back surface.

The individual through-holes 32 define, for example, columnar spaces. The axis 33 of each through-hole 32 extends parallel to a reference axis 34. The reference axis 34 passes through the core layer 31 at right angles to the front and back surfaces of the core layer 31. The through-holes 32 are filled with a conductive material. The conductive material is, for example, copper or solder. Thus, columnar vias 35 are formed. The vias 35 are electrically insulated from one another by the insulating material of the core layer 31.

The front surface of the core layer 31 is provided with a first conductive film 36. The first conductive film 36 extends from the reference axis 34 to the individual vias 35. Thus, the vias 35 are mutually connected, for each of the conductive pads 26, on the front surface of the core layer 31. A first stacked film 37 is stacked on the front surface of the core layer 3. The first stacked film 37 is formed of an insulating material, such as plastic. The first stacked film 37 covers the first conductive film 36 on the front surface of the core layer 31. Likewise, a second conductive film 39 is formed on the back surface of the core layer 31. The second conductive film 39 extends from the reference axis 34 to the individual vias 35. Thus, the vias 35 are mutually connected, for each of the conductive pads 22, on the back surface of the core layer 31. A second stacked film 41 is stacked on the back surface of the core layer 31. The second stacked film 41 is formed of an insulating material, such as plastic. The second stacked film 41 covers the second conductive film 39 on the back surface of the core layer 31.

The first stacked film 37 is provided with first conductive connecting vias 42. The first connecting vias 42 are formed of a conductive material, such as copper or solder. The first connecting vias 42 pass through the first stacked film 37 from the back surface to the front surface. The first connecting vias 42 are formed in, for example, a columnar shape. The first connecting vias 42 may be formed in a circular truncated conical shape that expands with distance from the core layer 31. The axis of each of the first connecting vias 42 is aligned with the reference axis 34. One first connecting via 42 is assigned to one conductive pad 26. The first connecting vias 42 are connected to the corresponding conductive pads 26.

The front surface of the first stacked film 37 is provided with a wiring pattern 43. The wiring pattern 43 is formed of a conductive material, such as copper. The wiring pattern 43 includes a conductive pad 44. The conductive pad 44 is connected to the first connecting via 42. The wiring pattern 43 is connected to the conductive pad 26. The conductive pad 44 is thus connected to the conductive pad 26. The wiring pattern 43 thus connects the conductive pad 26 and the conductive pad 44 in, for example, one-to-one correspondence.

The second stacked film 41 is provided with second conductive connecting vias 45. The second connecting vias 45 are formed of a conductive material, such as copper or solder. The second connecting vias 45 pass through the second stacked film 41 from the back surface to the front surface. The second connecting vias 45 are formed in, for example, a columnar shape. The second connecting vias 45 may be formed in a circular truncated conical shape that expands with distance from the core layer 31. The axis of each of the second connecting vias 45 is aligned with the reference axis 34. One second connecting via 45 is assigned to one conductive pad 22. The second connecting vias 45 are connected to the corresponding conductive pads 22. Thus, signal transmission paths are established by the conductive pad 26, the wiring pattern 43, the conductive pad 44, the first connecting via 42, the first conductive film 36, the plurality of vias 35, the second conductive film 39, the second connecting via 45, and the conductive pad 22.

Figure 3:
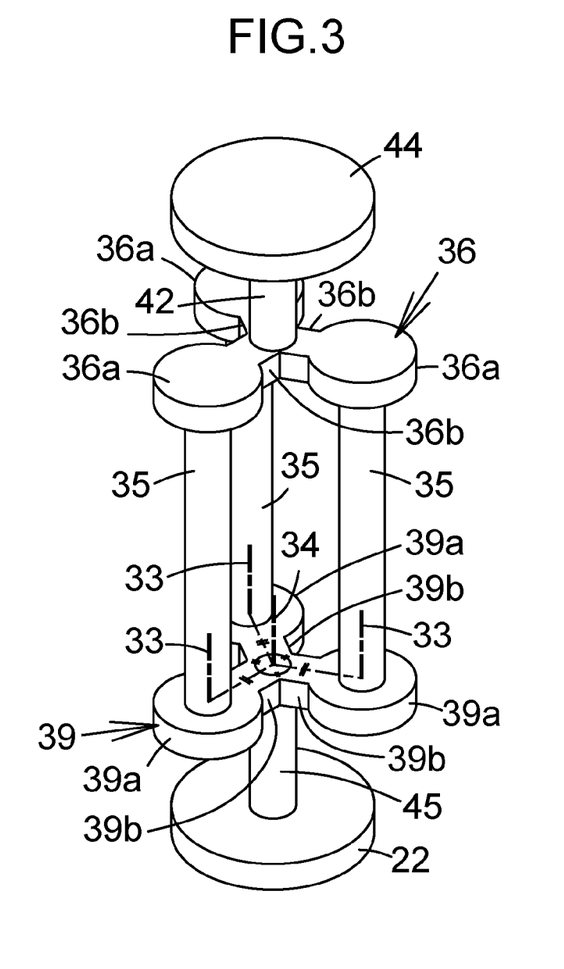
FIG. 3 is an enlarged schematic perspective view showing three vias.

As shown in FIG. 3, the outside diameters of the vias 35 (the diameters of circular cross sections of the columns) are set equal for each of the conductive pads 44 (22). The lengths of the vias 35 (from the upper end to the lower end) are set equal. The lengths of the vias 35 are measured parallel to the reference axis 34. The distances from the reference axis 34 to the axes 33 of the vias 35 are set equal. The axes 33 of the vias 35 are arranged at equal intervals around the reference axis 34. In other words, a structure constituted of the conductive pad 44, the first connecting via 42, the first conductive film 36, the plurality of (in this case, three) vias 35, the second conductive film 39, the second connecting via 45, and the conductive pad 22 is centered around the reference axis 34. Hence, the structure will be identical each time it rotates at a central angle of 120°.

As shown in FIG. 3, the first conductive film 36 is sectioned into conductive pads 36a for the individual vias 35. The conductive pads 36a are shaped like a disc. The central axes of the conductive pads 36a are aligned with the axes 33 of the vias 35. The conductive pads 36a are connected to one another with linear conductive wires 36b extending perpendicular to the reference axis 34. Likewise, the second conductive film 39 is sectioned into conductive pads 39a for the individual vias 35. The conductive pads 39a are shaped like a disc. The central axes of the conductive pads 39a are aligned with the axes 33 of the vias 35. The conductive pads 39a are connected to one another with linear conductive wires 39b extending from the reference axis 34 to the individual conductive pads 39a. The outside diameters of the conductive pads 36a and 39a are set larger than the outside diameters of the vias 35.

The conductive pads 44 and 22 are shaped like a disc. The central axes of the conductive pads 44 and 22 are aligned with the reference axis 34. The conductive pads 44 and 22 may be formed in another shape. Alternatively, the conductive pads 44 and 22 may be formed in different shapes.

In the package substrate 19, through whichever via 35 a signal is transmitted from the first connecting via 42 to the second connecting via 45, the wiring distances are equal. In other words, the signal is transmitted through an equal distance. Accordingly, this can avoid a signal phase lag among the vias 35. As a result, a good transmission characteristic can be provided.

In manufacturing the package substrate 19, the above-described through-holes 32 are mechanically cut with, for example, a drill. The drill should be a drill bit of one kind of pore size. In this process, the positions of the axes of the through-holes 32, that is, the distance between the axes of the through-holes 32 and the reference axis 34d should be set depending on a required transmission characteristic. Such setting can optimize the transmission characteristic depending on the thickness of the core layer 31.

Figure 4:
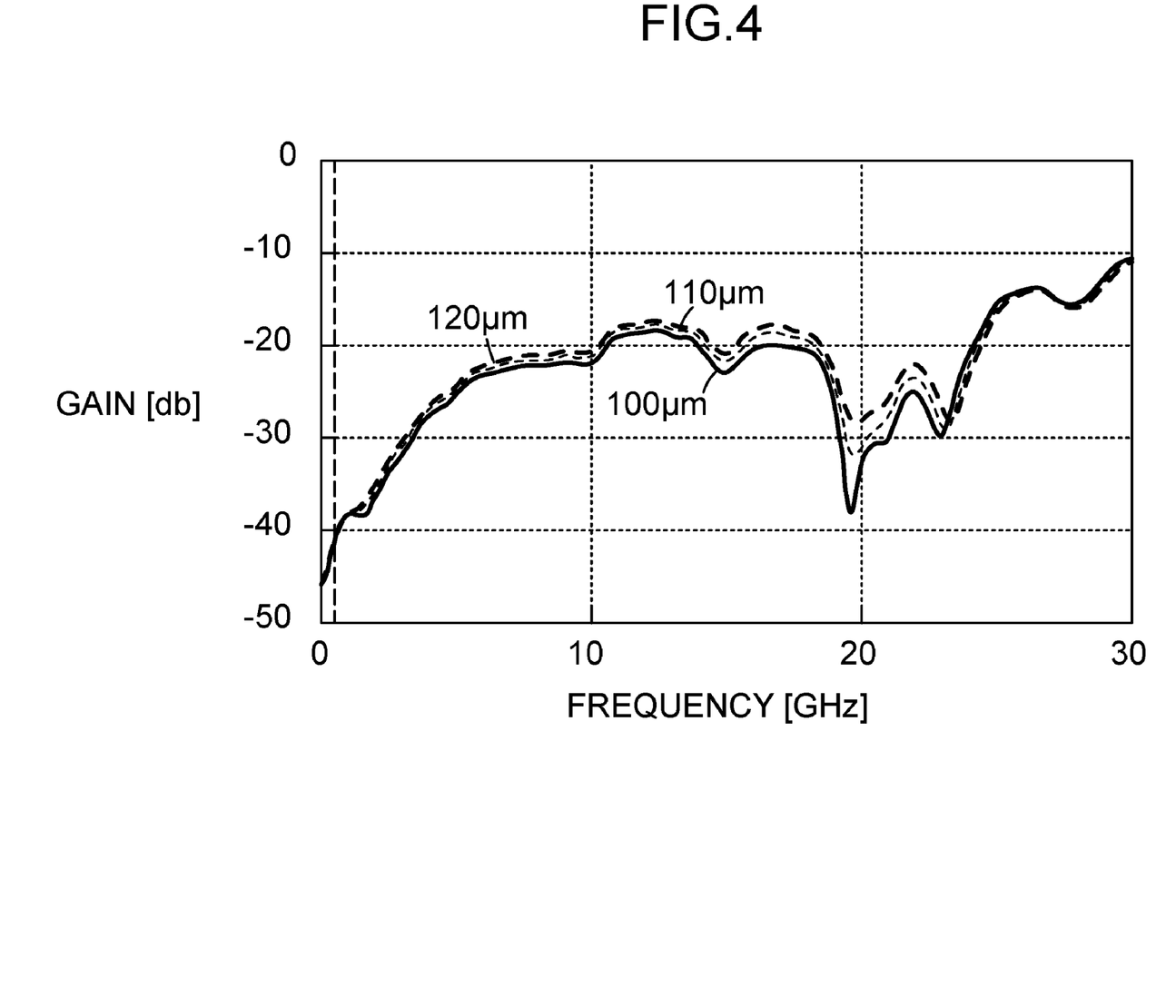
FIG. 4 is a graph showing S-parameters calculated with one modeled via.
Figure 5:
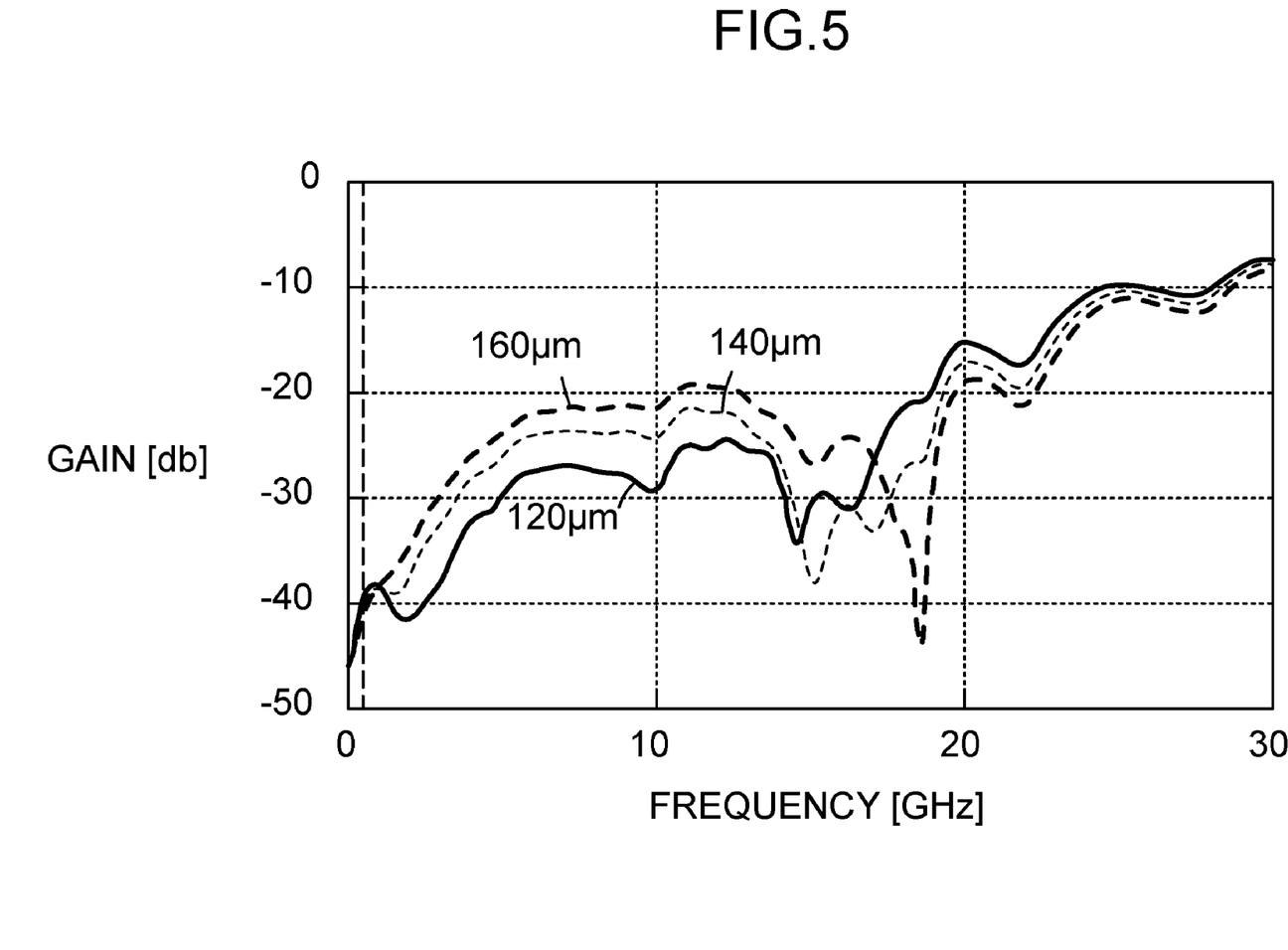
FIG. 5 is a graph showing S-parameters calculated with one modeled via.

The inventor verified the transmission characteristic of the vias 35 in the core layer 31 of the package substrate 19. At the verification, computer simulations were performed. S-parameters (S11) were calculated from the computer simulations. The S-parameters can specify a reflection loss of a signal input to the vias 35. First, the inventor modeled one via 35. In the modeling, the thickness of the core layer 31, that is, the length of the via 35, was set to 0.4 mm. Disc-shaped conductive pads were connected to the upper end and lower end of the via 35. The conductive pads each expanded on a plane perpendicular to the axis 33 of the via 35. The central axes of the conductive pads were aligned with the axis 33 of the via 35. The diameters of the conductive pads were set to 0.17 mm. The outside diameter of the via 35 was set to 100 μm, 110 μm, and 120 μm. As shown in FIG. 4, a good transmission characteristic was obtained irrespective of the outside diameter of the via 35 provided that the operating frequency is within about 500 MHz. It was confirmed that reduction in the outside diameter of the via 35 contributes to improving the transmission characteristic within operating frequencies from 500 MHz to 23.0 GHz. When the operating frequency becomes higher than 23.0 GHz, the influence of the outside diameter was decreased. Next, in the modeling, the thickness of the core layer 31 was set to 0.8 mm. The diameter of the conductive pad was maintained at 0.17 mm. The outside diameter of the via 35 was set to 120 μm, 140 μm, and 160 μm. As shown in FIG. 5, a good transmission characteristic was obtained irrespective of the outside diameter of the via 35 provided that the operating frequency is within about 500 MHz. It was confirmed that reduction in the outside diameter of the via 35 contributes to improving the transmission characteristic within operating frequencies from 500 MHz to 15.0 GHz. It was confirmed that when the operating frequency becomes higher than 17.5 GHz, an increase in the outside diameter contributes to improving the transmission characteristic. However, a significant increase in gain was confirmed when the operating frequency becomes higher than 20.0 GHz.

Figure 6:
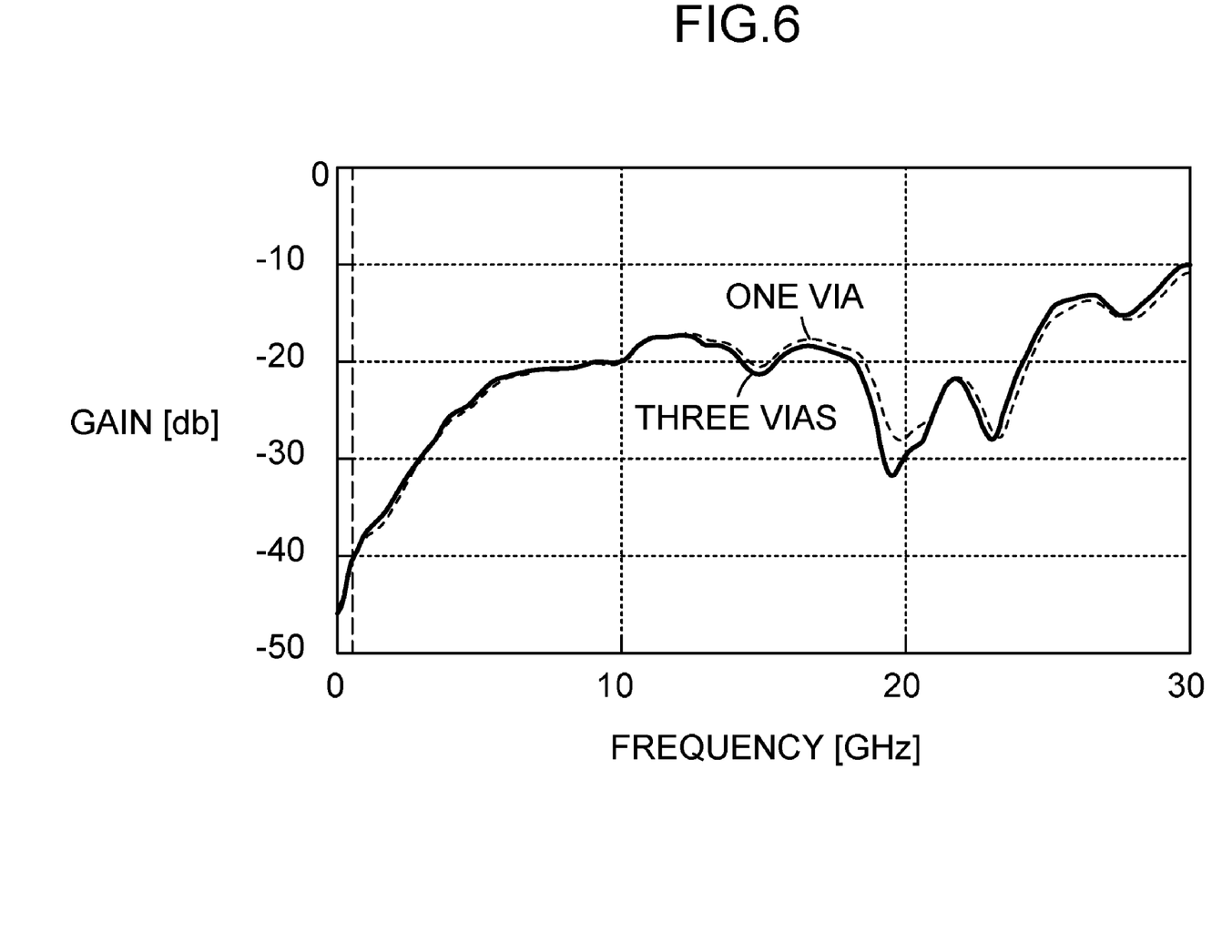
FIG. 6 is a graph showing the result of comparison between S-parameters calculated with three vias and S-parameters calculated with one via.

Next, the inventor compared three vias 35 and one via 35. In the comparison, the inventor modeled three vias 35. In the modeling, the thickness of the core layer 31 was set to 0.4 mm. The diameters of the conductive pads 36a and 39a were set to 0.10 mm. The outside diameters of the vias 35 were set to 0.07 mm. At the same time, the inventor modeled one via 35, as in the above. The thickness of the core layer 31 was likewise set to 0.4 mm. The diameters of the conductive pads were set to 0.17 mm. The outside diameter of the via 35 was set to 0.10 mm. In other words, the cross-sectional area of the via 35 was set equal to the total area of the three vias 35. As shown in FIG. 6, a good transmission characteristic was obtained irrespective of the number of the vias 35 provided that the operating frequency is within about 500 MHz. The three vias 35 exhibited a better transmission characteristic than that of one via 35 within operating frequencies from 11.5 GHz to 21.0 GHz. In particular, the three vias 35 exhibited a better transmission characteristic than that of one via 35 within operating frequencies of 20.0 GHz (corresponding to 40 Bbps)±1.0 GHz.

Figure 7:
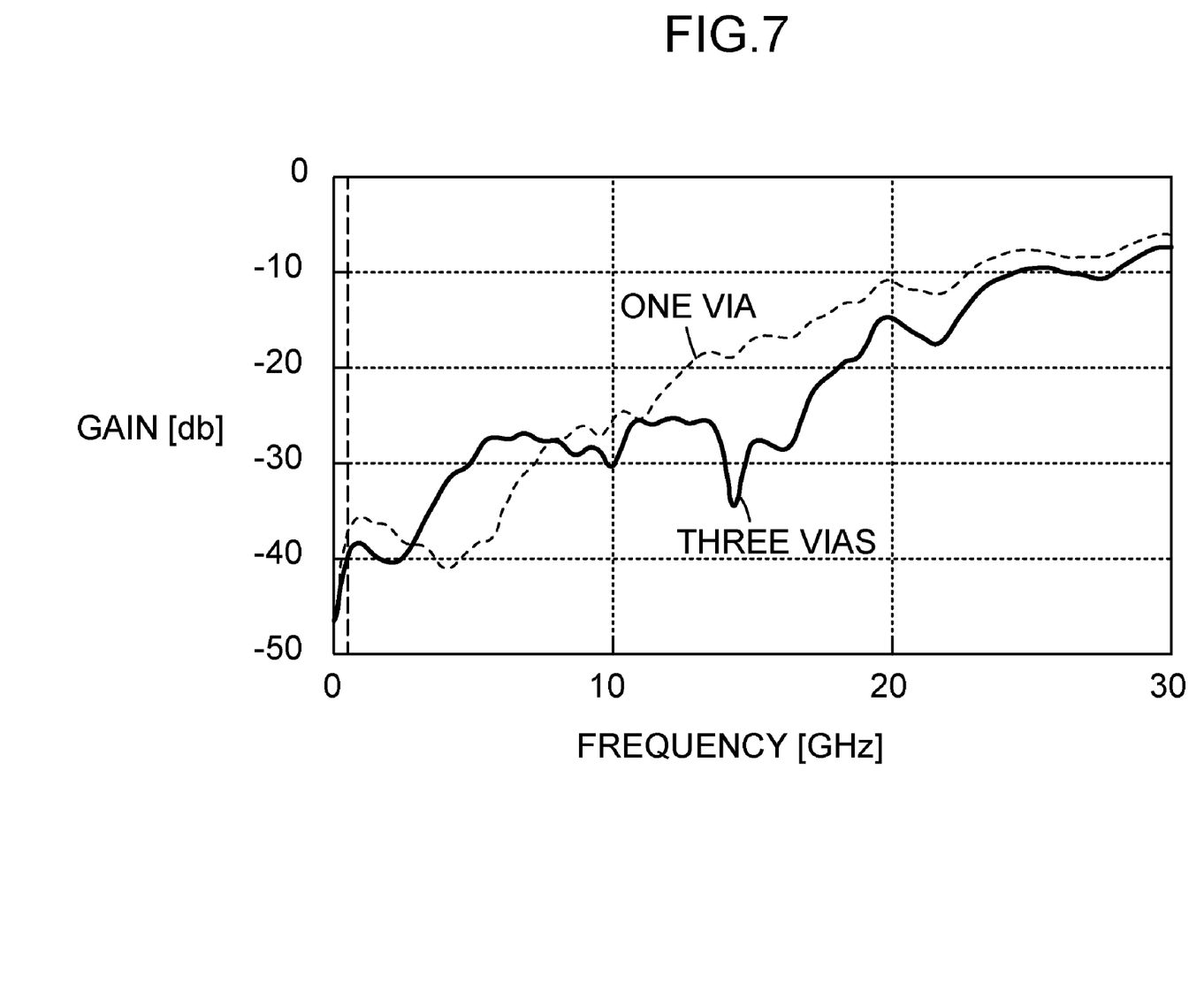
FIG. 7 is a graph showing the result of comparison between S-parameters calculated with three vias and S-parameters calculated with one via.

Next, the inventor compared three vias 35 and one via 35. In the comparison, the inventor modeled three vias 35. In the modeling, the thickness of the core layer 31 was set to 0.8 mm. The diameters of the conductive pads 36a and 39a were set to 0.10 mm. The outside diameters of the vias 35 were set to 0.07 mm. At the same time, the inventor modeled one via 35, as in the above. The thickness of the core layer 31 was likewise set to 0.8 mm. The diameters of the conductive pads were set to 0.10 mm. The outside diameter of the via 35 was set to 0.07 mm. In other words, the vias 35 themselves were set in the same shape. As shown in FIG. 7, when the operating frequency becomes higher than 7.9 GHz, the three vias 35 exhibited a better transmission characteristic than that of one via 35.

Figure 8:
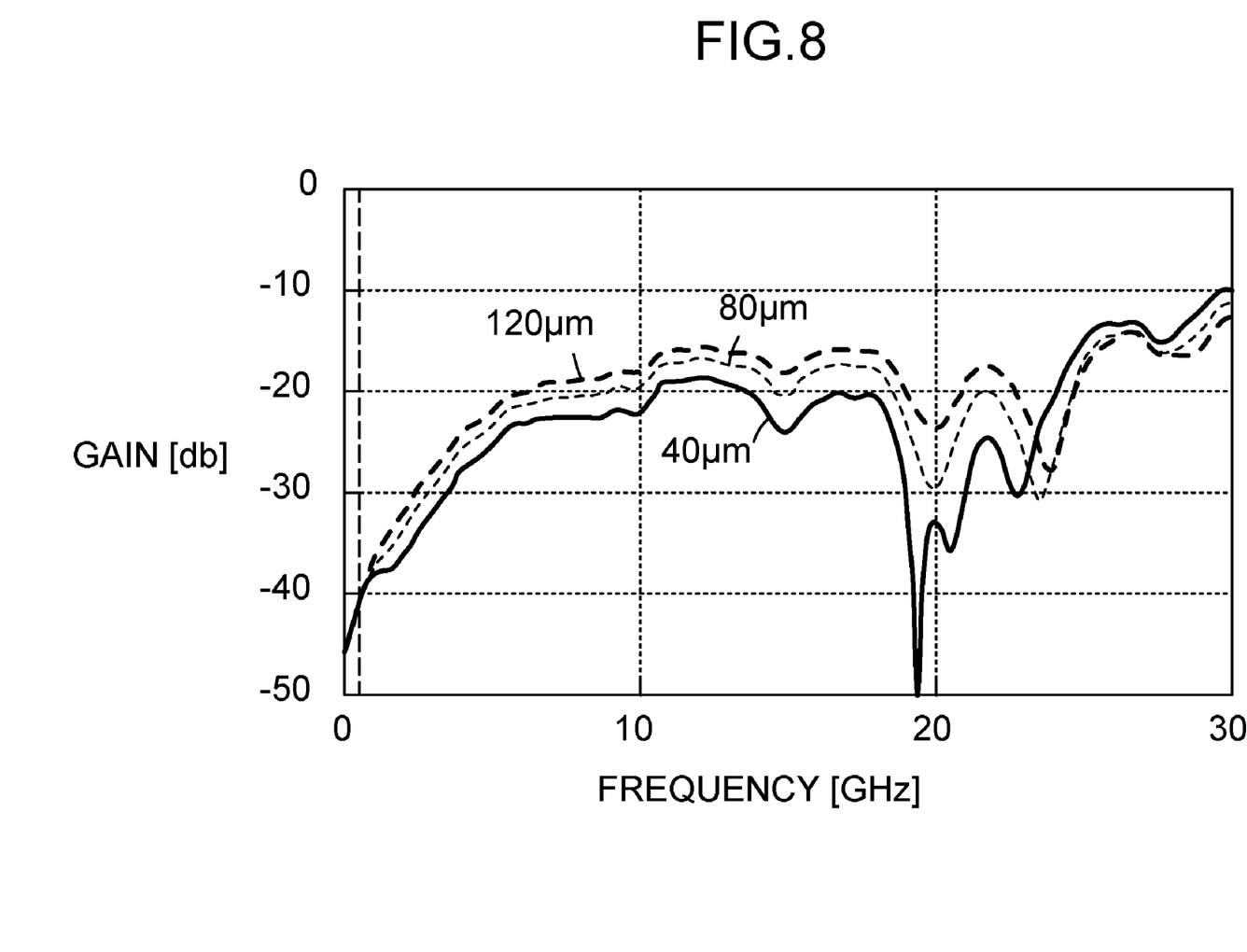
FIG. 8 is a graph showing S-parameters calculated with three vias when the thickness of a core layer is set to 0.4 mm.
Figure 9:
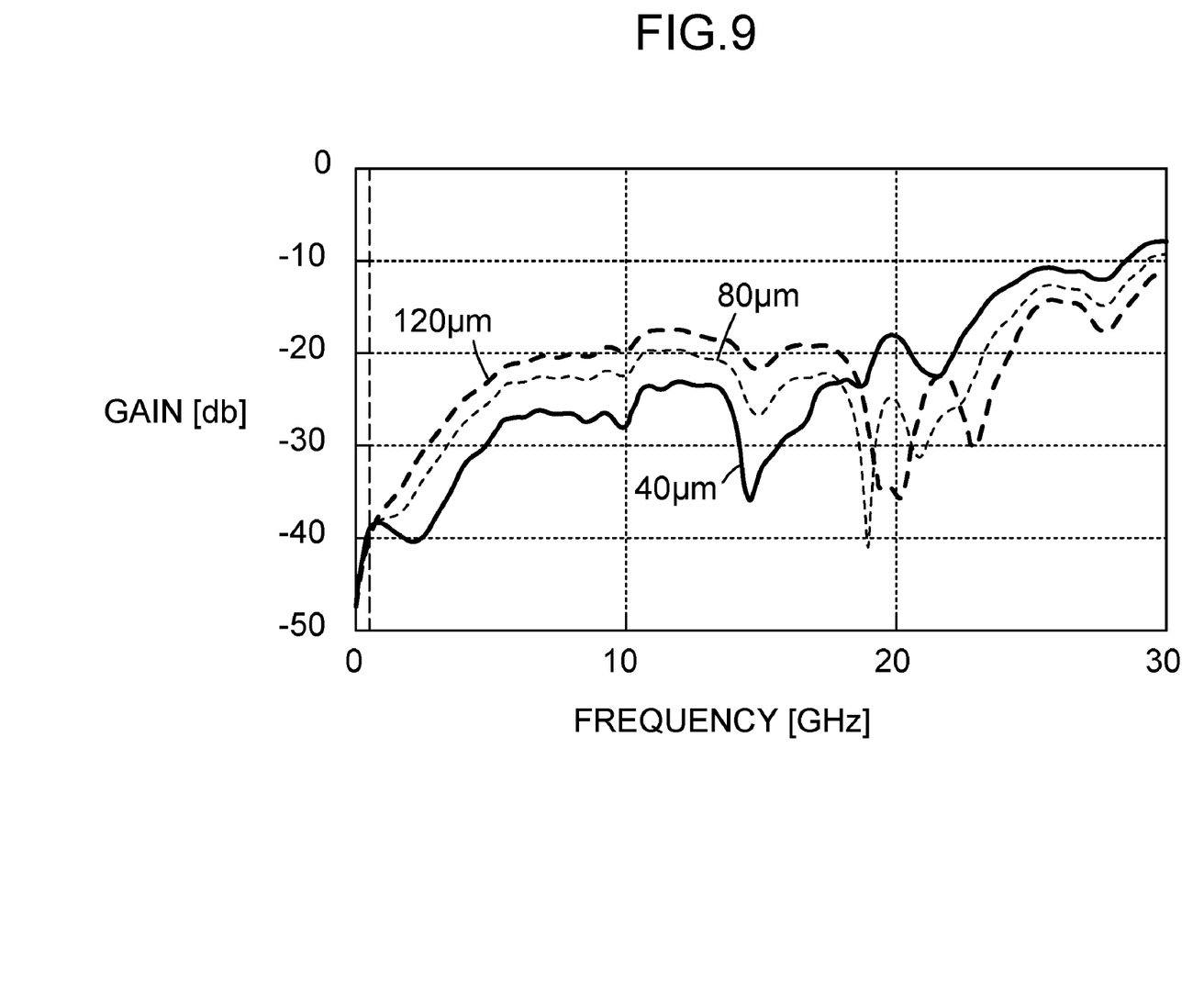
FIG. 9 is a graph showing S-parameters calculated with three vias when the thickness of the core layer is set to 0.6 mm.

Next, the inventor verified the transmission characteristic of the vias 35 while varying the thickness of the core layer 31. In the verification, three vias 35 were modeled. In the modeling, the thickness of the core layer 31 was set to 0.4 mm. The diameters of the conductive pads 36a and 39a were set to 0.10 mm. The outside diameters of the vias 35 were set to 0.05 mm. The distances between the reference axis 34 and the axes 33 of the vias 35 were set to 40 μm, 80 μm, and 120 μm. As shown in FIG. 8, a good transmission characteristic was obtained irrespective of the distances between the reference axis 34 and the axes 33 provided that the operating frequency is within about 500 MHz. It was confirmed that reduction in the distances between the reference axis 34 and the axes 33 contributes to improving the transmission characteristic within the operating frequencies from 500 MHz to 23.0 GHz. In other words, as in the case where the outside diameter of one via 35 was adjusted, it was confirmed that the transmission characteristic can be adjusted on the basis of the distances between the reference axis 34 and the axes 33. In particular, the vias 35 at a distance of 40 μm exhibited a good transmission characteristic within operating frequencies 20.0 GHz (corresponding to 40 Bbps)±1.0 GHz. Next, in the modeling, the thickness of the core layer 31 was set to 0.6 mm. The other conditions were maintained. As a result, as shown in FIG. 9, a good transmission characteristic was obtained irrespective of the distances between the reference axis 34 and the vias 35 provided that the operating frequency is within about 500 MHz. It was confirmed that reduction in the distances contributes to improving the transmission characteristic within the operating frequencies from 500 MHz to 17.5 GHz. It was confirmed that the transmission characteristic varies with changes in the thickness of the core layer 31. It was confirmed that such changes in transmission characteristic can be adjusted on the basis of the distances between the reference axis 34 and the axes 33. As in the case where the outside diameter of one via 35 was adjusted, it was confirmed that the transmission characteristic can be adjusted on the basis of the distances between the reference axis 34 and the axes 33.

Figure 10:
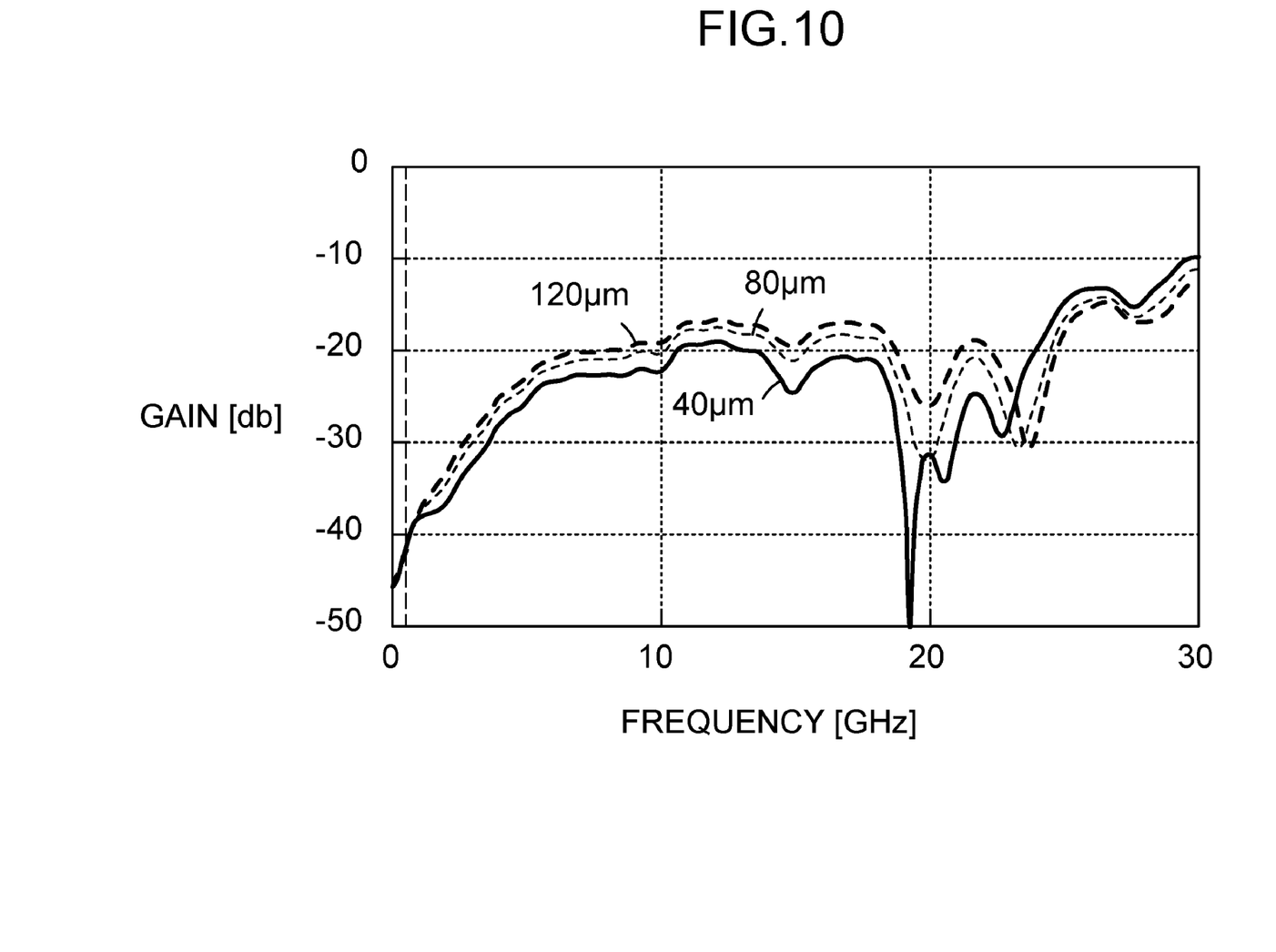
FIG. 10 is a graph showing S-parameters calculated with three vias when the diameters of conductive pads are set to 0.06 mm.
Figure 11:
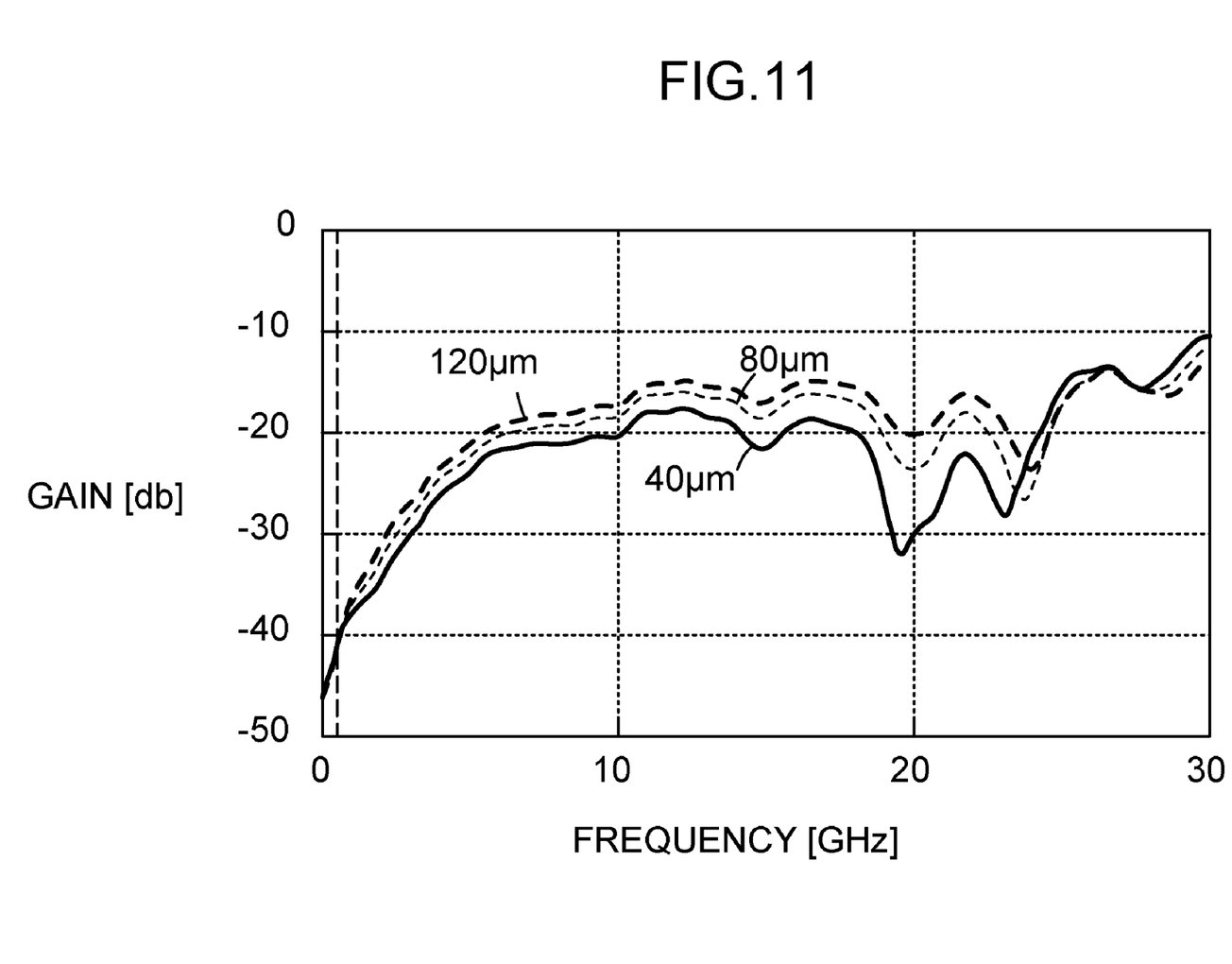
FIG. 11 is a graph showing S-parameters calculated with three vias when the outside diameters of the vias are set to 0.07 mm.

The inventor further verified the transmission characteristic of the three vias 35. In the verification, the inventor varied the diameters of the conductive pads 36a and 39a and the outside diameters of the vias 35. The diameters of the conductive pads 36a and 39a were set to 0.06 mm. At that time, the thickness of the core layer 31 was set to 0.4 mm, as in the above. The outside diameters of the vias 35 were set to 0.05 mm, as in the above. As shown in FIG. 10, a good transmission characteristic was obtained irrespective of the distances between the reference axis 34 and the axes 33 provided that the operating frequency is within about 500 MHz. It was confirmed that reduction in the distances between the reference axis 34 and the axes 33 contributes to improving the transmission characteristic within the operating frequencies from 500 MHz to 23.0 GHz. Next, the outside diameters of the vias 35 were set to 0.07 mm. The thickness of the core layer 31 was set to 0.4 mm, as in the above. The diameters of the conductive pads 36a and 39a were set to 0.10 mm, as in the above. As shown in FIG. 11, a good transmission characteristic was obtained irrespective of the distances between the reference axis 34 and the axes 33 provided that the operating frequency is within about 500 MHz. It was confirmed that reduction in the distances between the reference axis 34 and the axes 33 contributes to improving the transmission characteristic within the operating frequencies from 500 MHz to 23.4 GHz. It was confirmed that the transmission characteristic can be adjusted on the basis of the distances between the reference axis 34 and the axes 33 irrespective of the outside diameters of the vias 35 and the diameters of the conductive pads 36a and 39a.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments of the present inventions has been described in detail, it should be understood that various changes, substitutions, and alterations could be made hereto without departing from the spirit and scope of the invention.

What is claimed is:

1. A printed wiring board comprising:
   an insulating core layer;
   a plurality of conductive vias having axes parallel to a reference axis; the plurality of conductive vias being at equal distances from the reference axis and passing through the core layer from the front surface to the back surface;
   a first conductive film formed on the front surface of the core layer and expanding from the reference axis to each of the plurality of conductive vias;
   a first insulating film stacked on the front surface of the core layer and covering the first conductive film;
   wherein the first conductive film linearly extends individually from the reference axis to the vias;
   a first conductive connecting via having an axis identical to the reference axis and passing through the first stacked film from the back surface to the front surface;
   a second conductive film formed on the back surface of the core layer from the reference axis to each of the plurality of conductive vias;
   a second insulating film stacked on the back surface of the core layer and covering the second conductive film; and
   a second conductive connecting via having an axis identical to the reference axis and passing through the second stacked film from the back surface to the front surface.

2. The printed wiring board according to claim 1, wherein the vias are disposed at regular intervals around the reference axis.

3. The printed wiring board according to claim 2, wherein the first conductive film linearly extends individually from the reference axis to the vias.

4. The printed wiring board according to claim 3, wherein the plurality of vias are formed in a columnar shape with the same diameter.

5. The printed wiring board according to claim 2, wherein the plurality of vias are formed in a columnar shape with the same diameter.

6. The printed wiring board according to claim 1, wherein the plurality of vias are formed in a columnar shape with the same diameter.

7. The printed wiring board according to claim 1, wherein the plurality of vias are formed in a columnar shape with the same diameter.

8. An electronic component package comprising;
   an insulating core layer;
   a plurality of conductive vias having axes parallel to a reference axis; the plurality of conductive vias being at equal distances from the reference axis and passing through the core layer from the front surface to the back surface;
   a first conductive film formed on the front surface of the core layer from the reference axis to each of the plurality of conductive vias;
   a first insulating film stacked on the front surface of the core layer and covering the first conductive film;
   wherein the first conductive film linearly extends individually from the reference axis to the vias;
   a first conductive connecting via having an axis identical to the reference axis and passing through the first stacked film from the back surface to the front surface;
   an electronic component mounted on the first stacked film and having a terminal connected to the first connecting via;
   a second conductive film formed on the back surface of the core layer from the reference axis to each of the plurality of conductive vias;
   a second insulating film stacked on the back surface of the core layer and covering the second conductive film; and
   a second conductive connecting via having an axis identical to the reference axis and passing through the second stacked film from the back surface to the front surface.

9. The electronic-component package according to claim 8, wherein the vias are disposed at regular intervals around the reference axis.

10. The electronic-component package according to claim 9, wherein the first conductive film linearly extends individually from the reference axis to the vias.

11. The electronic-component package according to claim 10, wherein the plurality of vias are formed in a columnar shape with the same diameter.

12. The electronic-component package according to claim 9, wherein the plurality of vias are formed in a columnar shape with the same diameter.

13. The electronic-component package according to claim 8, wherein the plurality of vias are formed in a columnar shape with the same diameter.

14. The electronic-component package according to claim 8, wherein the plurality of vias are formed in a columnar shape with the same diameter.

* * * * *